US012069859B2

(12) United States Patent
Jin

(10) Patent No.: US 12,069,859 B2
(45) Date of Patent: Aug. 20, 2024

(54) SEMICONDUCTOR STRUCTURE WITH HIGH INTER-LAYER DIELECTRIC LAYER AND MANUFACTURING METHOD THEREOF

(71) Applicant: Changxin Memory Technologies, Inc., Anhui (CN)

(72) Inventor: Xing Jin, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 484 days.

(21) Appl. No.: 17/340,888

(22) Filed: Jun. 7, 2021

(65) Prior Publication Data

US 2021/0296350 A1    Sep. 23, 2021

Related U.S. Application Data

(63) Continuation of application No. PCT/CN2020/100251, filed on Jul. 3, 2020.

(30) Foreign Application Priority Data

Nov. 30, 2019  (CN) .......................... 201911208941.3

(51) Int. Cl.
*H10B 43/20* (2023.01)
*G11C 7/18* (2006.01)
(Continued)

(52) U.S. Cl.
CPC .............. *H10B 43/20* (2023.02); *G11C 7/18* (2013.01); *H10B 41/10* (2023.02); *H10B 41/20* (2023.02); *H10B 43/10* (2023.02)

(58) Field of Classification Search
CPC ........ H10B 43/20; H10B 41/10; H10B 41/20; H10B 43/10; G11C 7/18
(Continued)

(56) References Cited

U.S. PATENT DOCUMENTS 8,642,466 B2   2/2014  Kim
9,608,077 B1   3/2017  Kye et al.
(Continued)

FOREIGN PATENT DOCUMENTS

CN   102386127 A   3/2012
CN   103456694 A   12/2013
(Continued)

OTHER PUBLICATIONS

Extended European Search Report dated Aug. 26, 2022, issued in related European Patent Application No. 20891657.7 (7 pages).
(Continued)

*Primary Examiner* — Quoc D Hoang
(74) *Attorney, Agent, or Firm* — Sheppard Mullin Richter & Hampton LLP

(57) ABSTRACT

A semiconductor structure and a manufacturing method thereof are present. The method includes: forming a first mask layer having an etching window, wherein the first mask layer includes a first mask sublayer formed on the upper surface of bit line structures, and a second mask sublayer located on the upper surface of the first mask sublayer and the upper surface of an inter-layer dielectric layer, the first mask sublayer has the upper surface level with the upper surface of an inter-layer dielectric layer, and has a plurality of strip-shaped patterns extending in a first direction and spaced apart from each other, and the second mask sublayer has a plurality of strip-shaped patterns extending in a second direction and spaced apart from each other; and etching the inter-layer dielectric layer by using the first mask layer as a mask to form a contact hole exposing a surface of a substrate.

19 Claims, 7 Drawing Sheets

(51) Int. Cl.
*H10B 41/10* (2023.01)
*H10B 41/20* (2023.01)
*H10B 43/10* (2023.01)

(58) Field of Classification Search
USPC .......................................................... 257/314
See application file for complete search history.

(56) References Cited

U.S. PATENT DOCUMENTS

| | | |
|---|---|---|
| 2006/0146595 A1 | 7/2006 | Hong et al. |
| 2006/0228880 A1 | 10/2006 | McDaniel et al. |
| 2008/0113501 A1 | 5/2008 | McDaniel et al. |
| 2008/0266927 A1 | 10/2008 | Lee et al. |
| 2010/0164114 A1 | 7/2010 | Kang et al. |
| 2012/0205779 A1* | 8/2012 | Kim ................... H10B 12/033 257/532 |
| 2013/0240959 A1 | 9/2013 | Lee et al. |
| 2013/0292847 A1 | 11/2013 | Choi et al. |
| 2016/0049407 A1 | 2/2016 | Son et al. |
| 2022/0399346 A1 | 12/2022 | Kim et al. |

FOREIGN PATENT DOCUMENTS

| | | |
|---|---|---|
| CN | 106504985 A | 3/2017 |
| CN | 106941097 A | 7/2017 |
| CN | 108172620 A | 6/2018 |
| CN | 108231773 A | 6/2018 |
| CN | 109003938 A | 12/2018 |
| CN | 110364484 A | 10/2019 |

OTHER PUBLICATIONS

Examination Report dated Feb. 28, 2023, issued in related European Patent Application No. 20891657.7 (5 pages).
PCT International Preliminary Report on Patentability mailed Jun. 9, 2022, issued in related International Application No. PCT/CN2020/100251, with English translation (10 pages).
First Search dated May 8, 2022, issued in related Chinese Application No. 201911208941.3 (2 pages).
PCT International Search Report and the Written Opinion mailed Oct. 10, 2020, issued in related International Application No. PCT/CN2020/100251 (9 pages).

* cited by examiner

SEMICONDUCTOR STRUCTURE WITH HIGH INTER-LAYER DIELECTRIC LAYER AND MANUFACTURING METHOD THEREOF

CROSS-REFERENCE TO RELATED APPLICATIONS

This application is a continuation application of International Patent Application No.: PCT/CN2020/100251, filed on Jul. 3, 2020, which claims priority to Chinese Patent Application No.: 201911208941.3, filed on Nov. 30, 2019. The above-referenced applications are incorporated herein by reference in their entirety.

TECHNICAL FIELD

The present invention relates to the field of semiconductor integrated circuit manufacturing, and in particular, to a semiconductor structure and a manufacturing method thereof.

BACKGROUND

With the continuous development of semiconductor integrated circuit device technologies, how to optimize the manufacturing process to improve production efficiency and reduce production and operation costs of the manufacturer has become a major focus in the manufacturing process.

The semiconductor memory manufacturing technology has reached the 20 nm process. As the integration level of the semiconductor manufacturing process reaching a higher degree, the reduction of feature size becomes more difficult. In particular, to optimize the manufacturing process of a semiconductor memory array, various technical problems in the manufacturing processes of various components and the transition between different manufacturing processes need to be addressed.

SUMMARY

The embodiments of present invention provide a semiconductor structure and a manufacturing method thereof. The manufacturing method may help prevent the erosion of the material of a bit line structure when a contact hole is etched, thereby reducing the height of the bit line structure relative to the substrate and improving subsequent filling of the capacitor contact hole. Thus, the manufacturing process is optimized, and the manufacturing cycle is shortened.

One aspect of the present application is directed to a semiconductor manufacturing method. The semiconductor manufacturing method may include: providing a substrate, and forming a plurality of bit line structures on a surface of the substrate; forming an inter-layer dielectric layer between the adjacent bit line structures, the upper surface of the inter-layer dielectric layer may be higher than the upper surface of the bit line structures; forming a first mask layer having an etching window, the first mask layer may include a first mask sublayer and a second mask sublayer, the first mask sublayer may be formed on the upper surface of the bit line structures and may have a plurality of strip shaped patterns extending in a first direction and spaced apart from each other, the upper surface of the first mask sublayer may be level with the upper surface of the inter-layer dielectric layer, and the second mask sublayer may be located on the upper surface of the first mask sublayer and the upper surface of the inter-layer dielectric layer and may have a plurality of strip shaped patterns extending in a second direction and spaced apart from each other; and etching the inter-layer dielectric layer by using the first mask layer as a mask, to form a contact hole, the contact hole may expose the surface of the substrate.

In some embodiments, the plurality of bit line structures on the surface of the substrate may be spaced apart from each other, and the inter-layer dielectric layer may be formed between the adjacent bit line structures.

In some embodiments, the first direction may be perpendicular to the second direction.

In some embodiments, the inter-layer dielectric layer may include a first dielectric layer and a second dielectric layer. The first dielectric layer may be located between the adjacent bit line structures, the second dielectric layer may be located on the upper surface of the first dielectric layer, and the upper surface of the second dielectric layer may be higher than the upper surface of the bit line structures.

In some embodiments, forming the inter-layer dielectric layer between the adjacent bit line structures may include: forming the first dielectric layer between the adjacent bit line structures, the upper surface of the first dielectric layer may be level with the upper surface of the bit line structures; etching the first dielectric layer to cause the upper surface of the first dielectric layer to be lower than the upper surface of the bit line structures; forming the second dielectric layer between the adjacent bit line structures, the upper surface of the second dielectric layer may be level with the upper surface of the bit line structures.

In some embodiments, the method may further include: after forming the second dielectric layer between the adjacent bit line structures, performing an etching process to cause the upper surface of the bit line structures to be lower than the upper surface of the second dielectric layer.

In some embodiments, a height difference between the upper surface of the second dielectric layer and the upper surface of the bit line structures may be 20 to 40 nm.

In some embodiments, the method may further include: after performing the etching process to cause the upper surface of the bit line structures to be lower than the upper surface of the second dielectric layer, forming the first mask layer on the upper surface of the second dielectric layer and the upper surface of the bit line structures. The upper surface of the first mask layer on the upper surface of the second dielectric layer may be level with the upper surface of the first mask layer on the bit line structures.

In some embodiments, adhesion between the second dielectric layer and the first mask layer may be greater than adhesion between the first dielectric layer and the first mask layer.

In some embodiments, forming the first mask layer having the etching window may include: forming the first mask layer on the upper surface of the inter-layer dielectric layer and the upper surface of the bit line structures; forming a second mask layer on the first mask layer; forming, on the second mask layer, a photoresist layer that has a patterned opening, and performing a first etching process to remove the second mask layer directly below the patterned opening, an etching rate of the second mask layer may be higher than an etching rate of the first mask layer; and performing a second etching process to remove part of the first mask layer directly below the patterned opening to form the etching window of the first mask layer, an opening of the first mask layer may expose a surface of the second dielectric layer.

In some embodiments, during the second etching process, an etching by-product of the material of the first mask layer may be different from an etching by-product of the material of the inter-layer dielectric layer, and an etching by-product detection process may be performed during the second etching process, and the second etching process and the etching by-product detection process may be ended when the etching by-product of the material of the inter-layer dielectric layer is detected.

In some embodiments, the method may further include: after the second etching process, performing a third etching process to remove the second mask layer. The etching rate of the second mask layer may be higher than the etching rate of the first mask layer, and the etching rate of the second mask layer may be higher than an etching rate of the second dielectric layer.

In some embodiments, the method may further include: after the third etching process, performing a fourth etching process to remove the inter-layer dielectric layer directly below the patterned opening to form an opening of the inter-layer dielectric layer. The etching rate of the inter-layer dielectric layer may be higher than the etching rate of the first mask layer.

In some embodiments, the method may further include: after the bit line structures spaced apart from each other are formed on the surface of the substrate, forming a first sidewall film. The first sidewall film may be located on a sidewall of the bit line structures and a bottom of a gap between the adjacent bit line structures.

In some embodiments, the method may further include: after the fourth etching process, forming a second sidewall film on a sidewall and a bottom of the opening of the inter-layer dielectric layer. The material of the second sidewall film may be the same as the material of the first sidewall film.

In some embodiments, the method may further include: after forming the second sidewall film, performing a fifth etching process to remove the first sidewall film and the second sidewall film between the opening of the inter-layer dielectric layer and the substrate.

Another aspect of the present application is directed to a semiconductor structure. The semiconductor structure may include: a substrate, and a plurality of bit line structures located on the substrate; an inter-layer dielectric layer, the inter-layer dielectric layer may be located between the adjacent bit line structures, and the upper surface of the inter-layer dielectric layer may be higher than the upper surface of the bit line structures; and a first mask layer having an etching window, the first mask layer may include a first mask sublayer and a second mask sublayer, the first mask sublayer may be formed on the upper surface of the bit line structures and may have a plurality of strip shaped patterns extending in a first direction and spaced apart from each other, the upper surface of the first mask sublayer may be level with the upper surface of the inter-layer dielectric layer, and the second mask sublayer may be located on the upper surface of the first mask sublayer and the upper surface of the inter-layer dielectric layer and may have a plurality of strip shaped patterns extending in a second direction and spaced apart from each other. The second direction may be perpendicular to the first direction, and a contact hole may be disposed in the inter-layer dielectric layer directly below the etching window, the contact hole may expose the substrate.

In some embodiments, the semiconductor structure may further include a first sidewall film and a second sidewall film. The first sidewall film may be located on a sidewall of the bit line structures. The second sidewall film may be located on the sidewall of the contact hole and on a portion of the first sidewall film on the sidewall of the contact hole.

In some embodiments, the material of the first sidewall film may be the same as the material of the second sidewall film, and the material of the first sidewall film may include silicon nitride.

In some embodiments, the inter-layer dielectric layer may include a first dielectric layer and a second dielectric layer. The second dielectric layer may be located on the first dielectric layer, and the upper surface of the second dielectric layer may be higher than the upper surface of the bit line structures.

Compared with the prior art, in some embodiments of this application, the upper surface of the bit line structures may be lower than the upper surface of the inter-layer dielectric layer, and the upper surface of the mask layer on the bit line structures may be level with the upper surface of the mask layer on the inter-layer dielectric layer. In this way, when the opening of the mask layer is formed, the part of the mask layer on the plane of the upper surface of the inter-layer dielectric layer that is away from the bit line structures can be completely removed, while the part of the mask layer on the plane of the upper surface of the inter-layer dielectric layer that faces towards the bit line structures on the substrate can be retained. The retained part of the mask layer can protect the bit line structures in the subsequent etching process of the inter-layer dielectric layer, and prevent the erosion of the material of the upper surface of the bit line structures. Therefore, the material backfilling process of the bit line structures is no longer needed, the manufacturing process is optimized, and the manufacturing cycle is shortened. Additionally, since the material of the upper surface of the bit line structures will not be eroded, the height of the bit line structures relative to the substrate is reduced and the subsequent filling of the capacitor contact hole is improved.

In some embodiments, the first sidewall film may be formed to help prevent the exposure of the conductive substance in the bit line structures when the inter-layer dielectric layer is etched, thereby ensuring the performance of the bit line structures.

In some embodiments, the etching process may be used to cause the upper surface of the bit line structures to be lower than the upper surface of the inter-layer dielectric layer, without using an additional mask, thereby reducing the manufacturing costs.

BRIEF DESCRIPTION OF DRAWINGS

One or more embodiments provide exemplary descriptions by referring to the figures in corresponding accompanying drawings. These exemplary descriptions do not constitute limitation on the embodiments, and the figures in the accompanying drawings are not drawn on scale unless stated otherwise.

DESCRIPTION OF EMBODIMENTS

Figure 1:
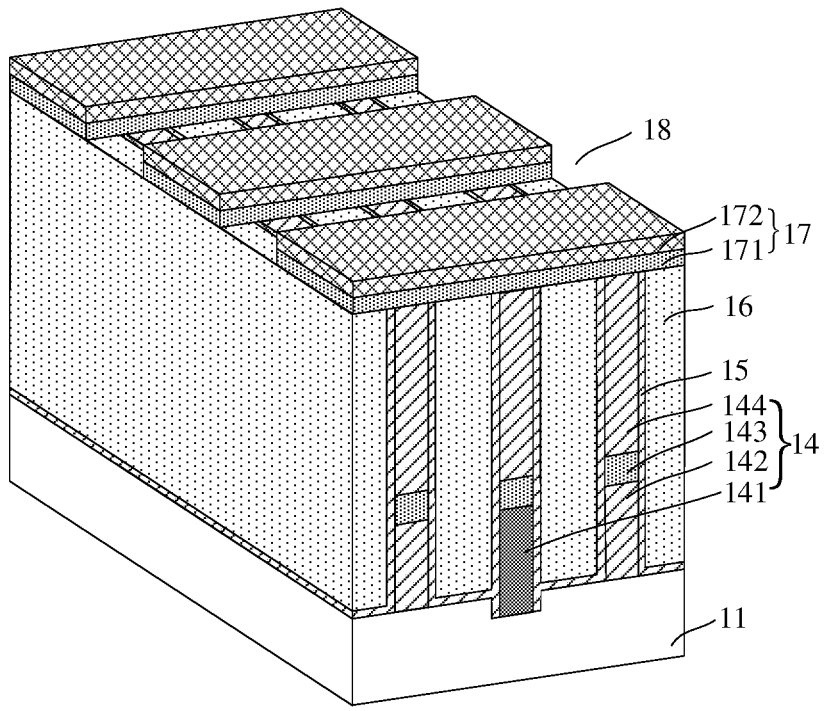
FIGS. 1 and 2 are schematic diagrams of cross-section structures corresponding to various steps of a semiconductor manufacturing method.
Figure 2:
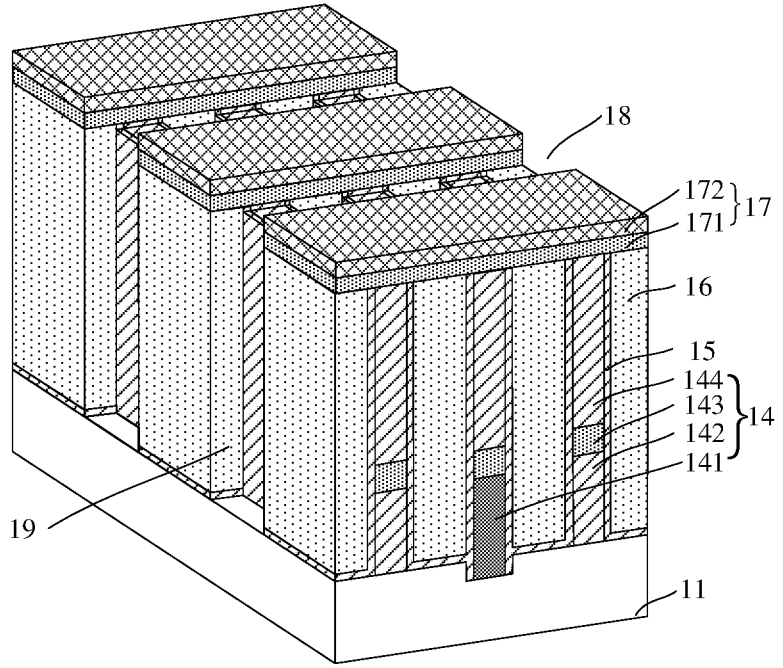

Existing manufacturing processes for forming a contact hole of a semiconductor structure may adversely affect the performance of the bit line structure. FIGS. 1 and 2 are schematic diagrams of cross-section structures corresponding to various steps of a semiconductor manufacturing method.

Referring to FIG. 1, the semiconductor structure may include a substrate 11, bit line structures 14 spaced apart from each other on the substrate 11, and an inter-layer dielectric layer 16. The upper surface of the bit line structures 14 may be level with the upper surface of the inter-layer dielectric layer 16. Additionally, a first sidewall film 15 may be further disposed between the bit line structures 14 and the inter-layer dielectric layer 16. The first sidewall film 15 may be further located between the inter-layer dielectric layer 16 and the substrate 11.

A mask layer 17 may be covered on the bit line structures 14 and the inter-layer dielectric layer 16. The mask layer 17 may include a first mask layer 171 and a second mask layer 172. The first mask layer 171 may be a bottom anti-reflection coating and may be configured to alleviate problems such as light reflection and standing waves. The material of the first mask layer 171 usually may be an organic material. Usually, organic materials are selected as the material of a photoresist, and different organic materials have a relatively small etching selection ratio in the same etching process, which cannot meet the etching selection ratio needed for transferring patterns between layers. Therefore, in the pattern transfer process after photoresist exposure and development, the second mask layer 172 may be disposed between a photoresist layer (not shown in FIG. 1) and the first mask layer 171. The etching selection ratio of the material of the second mask layer 172 to the material of the photoresist may be greater than the etching selection ratio of the material of the first mask layer 171 to the material of the photoresist, thereby preventing the photoresist layer from being etched during the pattern transfer, and ensuring the dimensional accuracy of the transferred pattern.

The bit line structure 14 may include a bottom dielectric layer 142, a conductive body layer 143, an upper dielectric layer 144, and a bit line contact 141. The material of the bottom dielectric layer 142 and the upper dielectric layer 144 may include silicon nitride, silicon oxide, or silicon oxynitride, and the material of the conductive body layer 143 may include tungsten or a tungsten composite. The bit line contact 141 may be connected to an active area, and the material of the bit line contact 141 may include tungsten or polysilicon.

The material of the second mask layer 172 usually may be silicon oxynitride. When selecting etching processes for etching different materials, the etching process corresponding to silicon nitride is usually the same as the etching process corresponding to silicon oxynitride. That is, the etching selection ratio of silicon nitride to silicon oxynitride is relatively small in the same etching process.

Regardless of the etching selection ratio of one material to another material, when etching one material, another material contacted by an etchant can also be eroded during the etching. The etching rate difference between the two materials is related to the etching selection ratio of the two materials. A larger etching selection ratio indicates a larger etching rate difference, and a smaller etching selection ratio indicates a smaller etching rate difference.

Referring to FIG. 2, the mask layer 17 may be etched to form an opening 18. The opening 18 may expose the upper surface of the upper dielectric layer 144, the upper surface of the inter-layer dielectric layer 16, and the upper surface of the first sidewall film 15 between the bit line structures 14 and the inter-layer dielectric layer 16. The inter-layer dielectric layer 16 may be etched via the opening 18, and the etching process may consume part of the material of the upper dielectric layer 144 because the selection ratio of the inter-layer dielectric layer 16 to the upper dielectric layer 144 of the bit line structure 14 is relatively small. When removing the mask layer 17 and the first sidewall film 15 at the bottom of the opening 18 subsequently, because the first sidewall film 15 and the upper dielectric layer 144 may be made of the same material, and a selection ratio of the second mask layer 172 to the upper dielectric layer 144 may be small, the upper dielectric layer 144 of the bit line structure 14 may be greatly eroded, and the conductive body layer 143 may be exposed by the etching.

To prevent the exposure of the conductive body layer 143 of the bit line structure 14 due to the erosion of the material of the upper dielectric layer 144 during the etching process, usually, the thickness of the upper dielectric layer 144 would be increased when forming the bit line structure 14, and the upper dielectric layer 144 would be backfilled in a subsequent process to restore the upper dielectric layer 144 to the height before etching. However, this process increases the processing time and prolongs the semiconductor manufacturing cycle.

Additionally, in an actual manufacturing process, the bit line structures may be level with the inter-layer dielectric layer 16 after the thickness of the upper dielectric layer 144 is increased, resulting in an increase in the depth to width ratio of the contact hole 19, and an increase in the process difficulty in etching the contact hole 19 and subsequently filling a conductive layer in the contact hole 19.

To resolve the foregoing technical problems, this application provides a semiconductor manufacturing method. In some embodiments, the upper surface of the bit line structures may be lower than the upper surface of the inter-layer dielectric layer, and the upper surface of the mask layer on the bit line structures may be level with the upper surface of the mask layer on the inter-layer dielectric layer. In this way, when an opening of the mask layer is formed, the part of the mask layer on the plane of the upper surface of the inter-layer dielectric layer that is away from the bit line structures can be completely removed, while the part of the mask layer on the plane of the upper surface of the inter-layer dielectric layer that faces towards the bit line structures on the substrate can be retained. The retained part of the mask layer can protect the bit line structures in a subsequent etching process of the inter-layer dielectric layer, and prevent the erosion of the material of the bit line structures, thereby optimizing the manufacturing process and shortening the manufacturing cycle.

To make the objectives, technical solutions, and advantages of the embodiments of this invention clearer, the embodiments of this invention are described in detail with reference to the accompanying drawings. A person of ordinary skill in the art should understand that many technical details have been proposed in the embodiments of this invention to provide a better understanding of this invention to the readers. However, the technical solutions claimed in this invention may be implemented even without these technical details and various changes and modifications based on the following embodiments.

FIGS. 3, 4, 5, 6, 7, 8, 9, 10, 11, 12, 13, and 14 are schematic diagrams of cross-section structures corresponding to various steps of a semiconductor manufacturing method in accordance with an embodiment of this invention.

Figure 3:
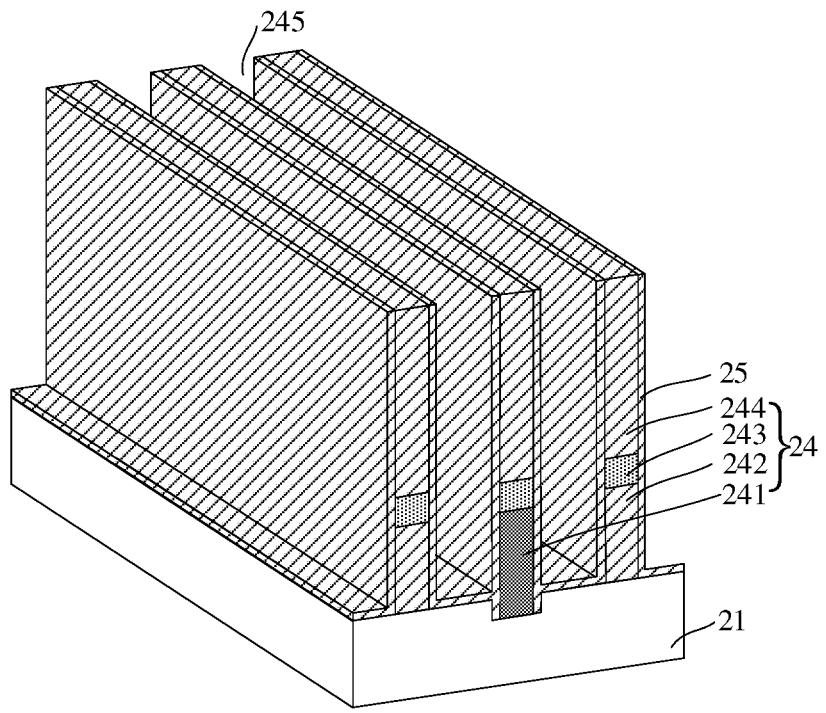
FIGS. 3, 4, 5, 6, 7, 8, 9, 10, 11, 12, 13, and 14 are schematic diagrams of cross-section structures corresponding to various steps of a semiconductor manufacturing method in accordance with an exemplary embodiment of the present invention.

Referring to FIG. 3, a substrate 21 may be provided, and a plurality of bit line structures 24 spaced apart from each other may be formed on the substrate 21. A gap 245 may be disposed between the adjacent bit line structures 24. A first sidewall film 25 may be formed, and the first sidewall film 25 may be located at the sidewall of the bit line structures 24 and the bottom of the gap 245.

The substrate 21 usually may include a plurality of active areas (not shown in FIG. 3), a plurality of embedded word lines, and a plurality of shallow trench isolation structures. The shallow trench isolation structures may be configured to isolate the adjacent active areas from each other. The embedded word line may include a gate dielectric layer, a conductive material layer, and a word line isolation layer. The gate dielectric layer and the word line isolation layer of the substrate may coat the conductive material layer together, and the conductive material layer may be connected to the active area through the gate dielectric layer.

The bit line structures 24 may be located on the substrate 21. The bit line structure 24 may include a bottom dielectric layer 242, a conductive body layer 243, an upper dielectric layer 244, and a bit line contact 241. The material of the bottom dielectric layer 242 and the upper dielectric layer 244 may include silicon nitride, silicon oxide, or silicon oxynitride, and the material of the conductive body layer 243 may include tungsten or a tungsten composite. The bit line contact 241 may be connected to the active area, and the material of the bit line contact 241 may include tungsten or polysilicon.

In some embodiments, a deposition process may be performed after the bit line structures 24 are formed. The material on the upper surface of the bit line structures 24 may be removed after the deposition process, while the residual material may be used as the first sidewall film 25. The material of the first sidewall film 25 may include silicon nitride or silicon oxynitride.

In some embodiments, the material at the bottom of the gap and the material on the upper surface of the bit line structures may be removed after the deposition process, while the residual material may be used as the first sidewall film. That is, the first sidewall film may be located on the sidewall of the bit line structures.

Figure 4:
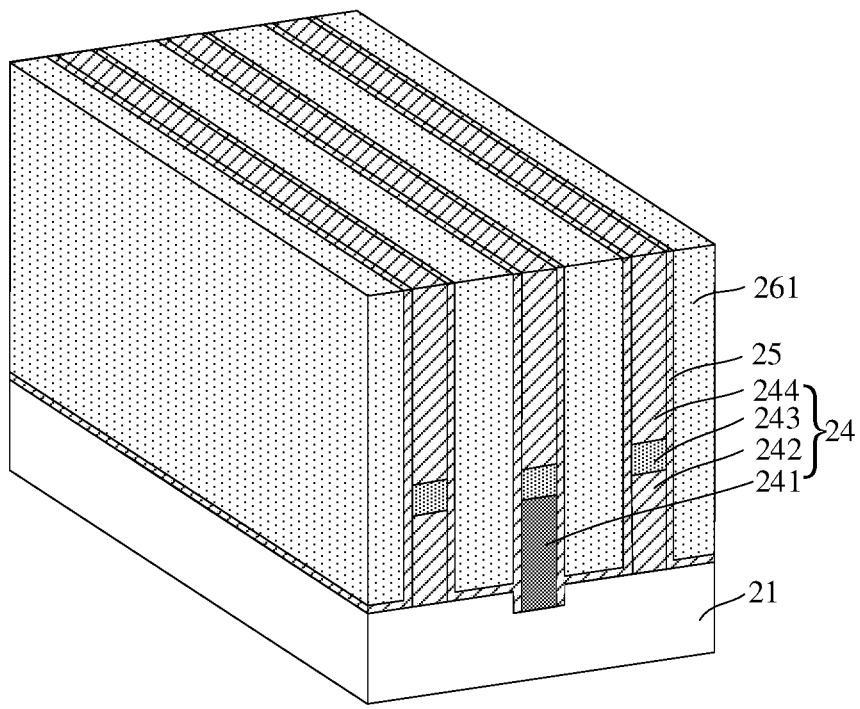

Referring to FIG. 4, a first dielectric layer 261 may be formed. The first dielectric layer 261 may be spaced apart from the bit line structures 24, and the upper surface of the bit line structures 24 may be level with the upper surface of the first dielectric layer 261.

The first dielectric layer 261 may be located in the gap between the adjacent bit line structures 24 and the surrounding area of the bit line structures 24. The first dielectric layer 261 may be formed by using a spin-on deposition (SOD) or a chemical vapor deposition process, and a planarization process may be performed after the deposition process to cause the upper surface of the first dielectric layer 261 to be level with the upper surface of the bit line structures 24.

Figure 5:
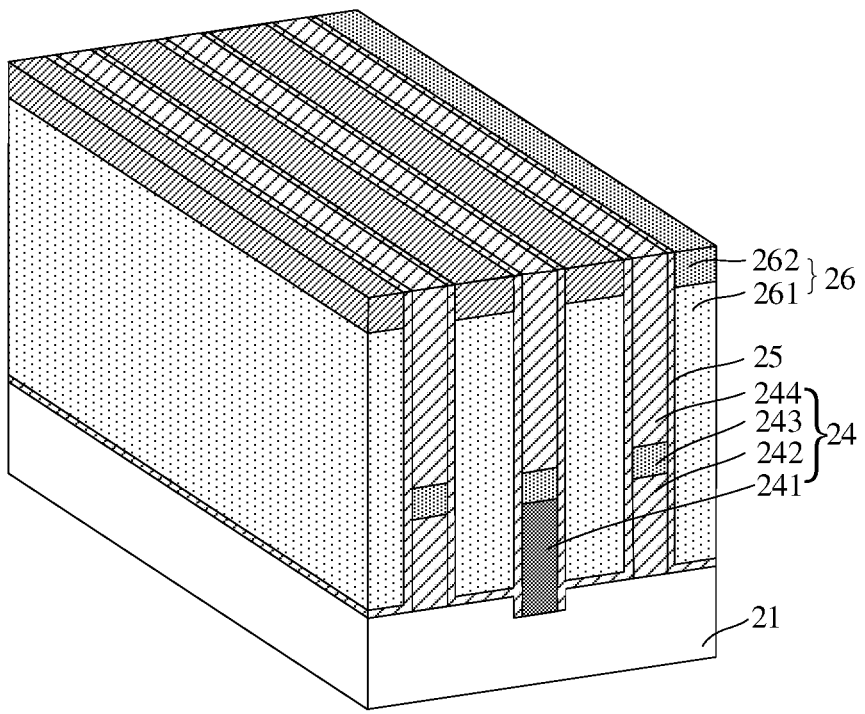

Referring to FIG. 5, an etching process may be used to remove part of the first dielectric layer 261, and a second dielectric layer 262 may be backfilled. The upper surface of the second dielectric layer 262 may be level with the upper surface of the bit line structures 24.

The etching process may be used to remove part of the first dielectric layer 261. The height difference between the upper surface of the first dielectric layer 261 and the upper surface of the bit line structures 24 may be 20 nm to 40 nm, for example, 25 nm, 30 nm, or 35 nm.

The etching process may be whole-surface dry etching, during which a specific material may be etched by adjusting the composition of an etchant without forming an additional mask layer. This may help optimize manufacturing processes and reduce manufacturing costs. Additionally, dry etching can achieve higher etching accuracy than wet etching. Therefore, the depth of a groove formed by etching can be accurately controlled when removing part of the first dielectric layer 261 by using the dry etching process.

After the etching process, the deposition process may be performed to form the second dielectric layer 262. The upper surface of the second dielectric layer 262 may be level with the upper surface of the bit line structures 24. The first dielectric layer 261 and the second dielectric layer 262 may constitute the inter-layer dielectric layer 26. The material of the second dielectric layer 262 may include tetraethyl orthosilicate (TEOS). The adhesion between the material of the second dielectric layer 262 and the material of a subsequently formed mask layer may be greater than the adhesion between the material of the first dielectric layer 261 and the material of the subsequently formed mask layer, thereby preventing the mask layer from slipping in a manufacturing process, and ensuring the etching accuracy.

Figure 6:
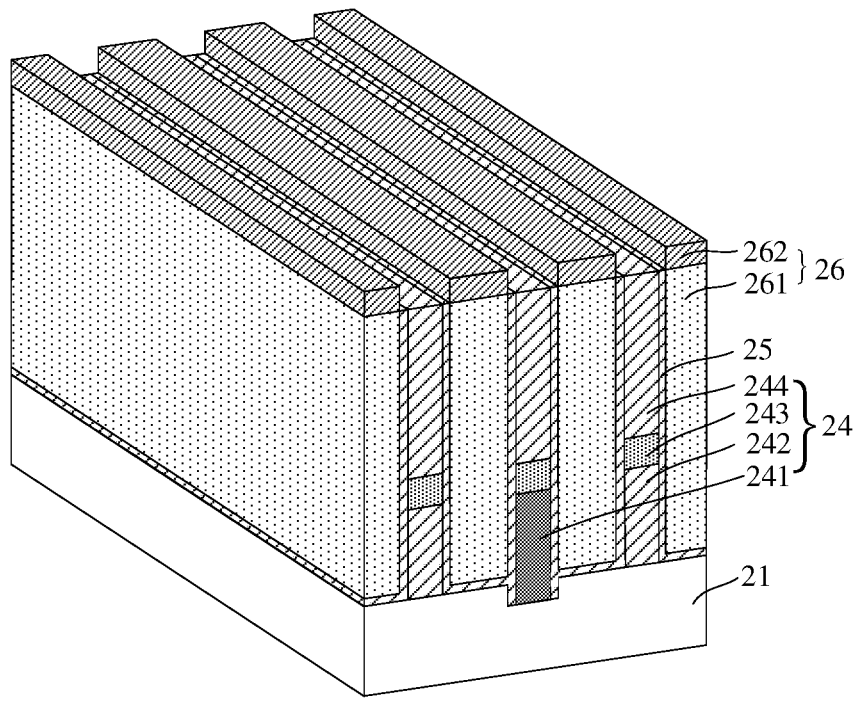

Referring to FIG. 6, part of the material of the upper dielectric layer 244 may be removed by using the etching process to cause the upper surface of the bit line structures 24 to be lower than the upper surface of the inter-layer dielectric layer 26.

The upper dielectric layer 244 and the first sidewall film 25 may be etched to cause the upper surface of the upper dielectric layer 244 to be level with the upper surface of the first sidewall film 25 between the inter-layer dielectric layer 26 and the bit line structures 24 and lower than the upper surface of the inter-layer dielectric layer 26.

In some embodiments, the height difference between the upper surface of the inter-layer dielectric layer 26 and the upper surface of the bit line structures 24 may be 20 nm to 40 nm, for example, 25 nm, 30 nm, 35 nm. In a subsequent mask layer forming process, the material of the mask layer may be filled between adjacent inter-layer dielectric layers 26. That is, after the opening of the mask layer is formed, the thickness of the mask layer below the opening and above the bit line structures 24 may be the height difference between the upper surface of the inter-layer dielectric layer 26 and the upper surface of the bit line structures 24. The mask layer at this position may be configured to prevent the erosion of the material of the upper dielectric layer 244.

The material of the mask layer may be eroded because of the contact with the etchant. Therefore, the thickness of the mask layer below the opening of the mask layer and above the bit line structures 24 may be related to the type of the etchant that the mask layer is in contact with and the contact time in the manufacturing process.

Additionally, in some embodiments, the upper surface of the bit line structures 24 may be level with the upper surface of the first dielectric layer 261. In some embodiments, the upper surface of the bit line structures may be higher than or lower than the upper surface of the first dielectric layer.

Figure 7:
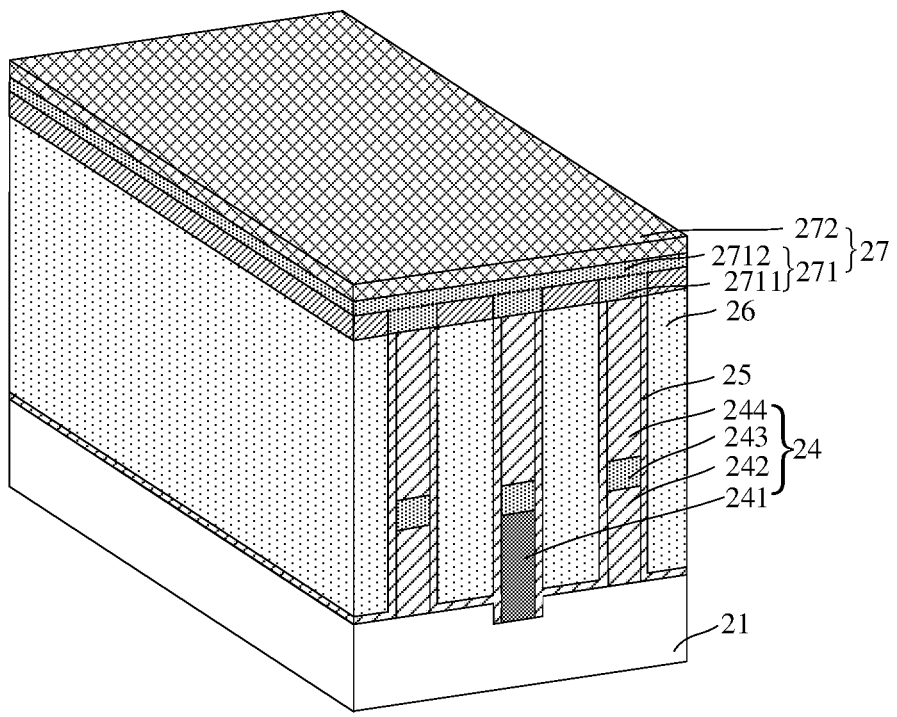

Referring to FIG. 7, a mask layer 27 may be formed. The mask layer 27 may be located on the bit line structures 24 and the inter-layer dielectric layer 26, and located between the adjacent inter-layer dielectric layers 26.

The mask layer 27 may be formed by the following step: forming a first mask layer 271 and a second mask layer 272 that are stacked in sequence. The etching selection ratio of the material of the first mask layer 271 to the material of the inter-layer dielectric layer 26 may be greater than the etching selection ratio of the material of the second mask layer 272 to the material of the inter-layer dielectric layer 26. The first mask layer 271 may be a carbon coating layer, and the material of the second mask layer 272 may include silicon oxynitride.

The first mask layer 271 may be located between the adjacent inter-layer dielectric layers 26. In this way, the first mask layer 271 can better alleviate problems such as light reflection and standing waves. In the subsequent etching process of the inter-layer dielectric layer 26 through the opening of the mask layer 27, because the etching selection ratio of the material of the first mask layer 271 to the material of the inter-layer dielectric layer 26 is relatively higher, it may help protect the upper dielectric layer 244 from being damaged by the etching.

In some embodiments, the first mask layer 271 may include a first mask sublayer 2711. The first mask sublayer 2711 may be formed on the upper surface of the bit line structures 24 and may have a plurality of strip-shaped patterns extending in a first direction and spaced apart from each other, and the upper surface of the first mask sublayer 2711 may be level with the upper surface of the inter-layer dielectric layer 26.

The first mask layer 271 may further include a second mask sublayer 2712. The second mask sublayer 2712 may be located on part of the upper surface of the first mask sublayer 2711 and the upper surface of the inter-layer dielectric layer 26, and the second mask sublayer 2712 may have a plurality of strip-shaped patterns extending in a second direction and spaced apart from each other. In some embodiments, the first direction may be perpendicular to the second direction.

Figure 8:
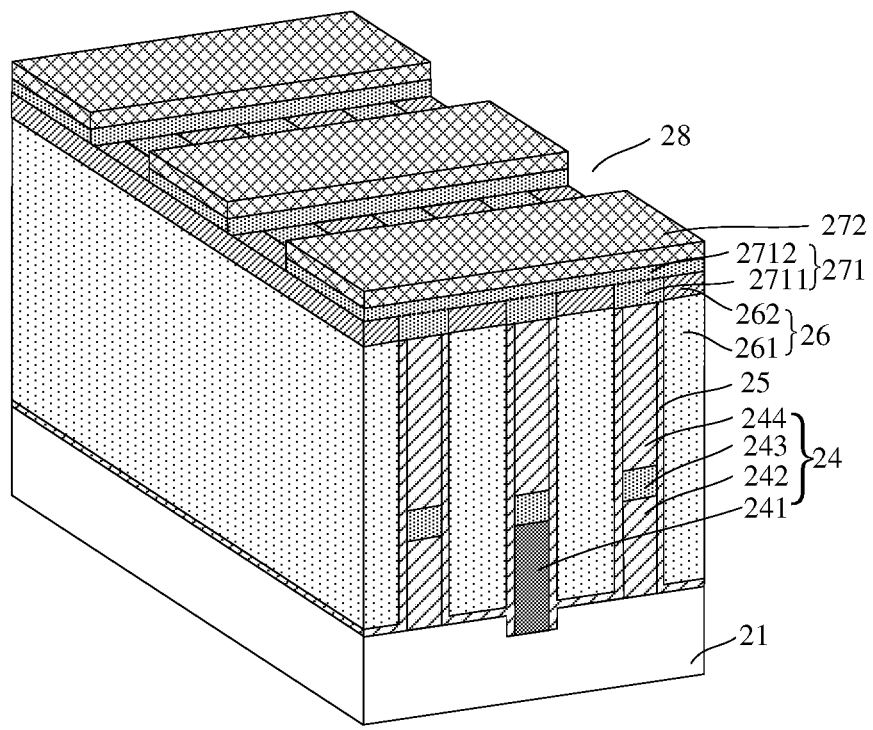

Referring to FIG. 8, an opening 28 may be formed in the mask layer 27. The opening 28 may expose part of the surface of the first mask sublayer 2711.

A patterned photoresist layer may be disposed on the second mask layer 272. A first etching process may be used to etch the second mask layer 272 through the patterned opening of the photoresist layer, and a second etching process may be used to etch the first mask layer 271 to form the opening 28. In the first etching process, the etching rate of the material of the second mask layer 272 may be greater than the etching rate of the material of the first mask layer 271. In the second etching process, the etching rate of the material of the first mask layer 271 may be greater than the etching rate of the material of the second mask layer 272.

The second etching process may be performed to etch the first mask layer 271. Since organic materials may be selected as the material of both the first mask layer 271 and the photoresist, the second etching process may remove the photoresist on the second mask layer 272 simultaneously.

In some embodiments, when etching the first mask layer 271, because the etching by-product of the material of the first mask layer 271 is different from the etching by-product of the inter-layer dielectric layer 26, detection of etching by-product may be performed when the second etching process is performed to etch the first mask layer 271. The second etching process may end when the etching by-product of the inter-layer dielectric layer 26 is detected. When etching the first mask layer 271, the etching by-product of the material of the first mask layer 271 may be different from the etching by-product of the second dielectric layer 262.

In some embodiments, self-aligned double patterning (SADP) may be used to form the opening of the second mask layer 272.

Figure 9:
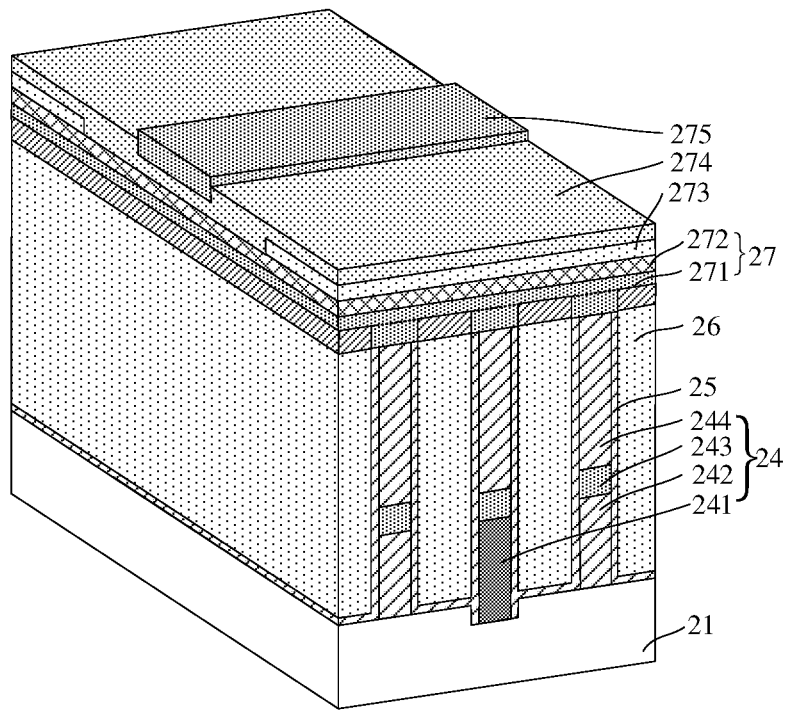
Figure 10:
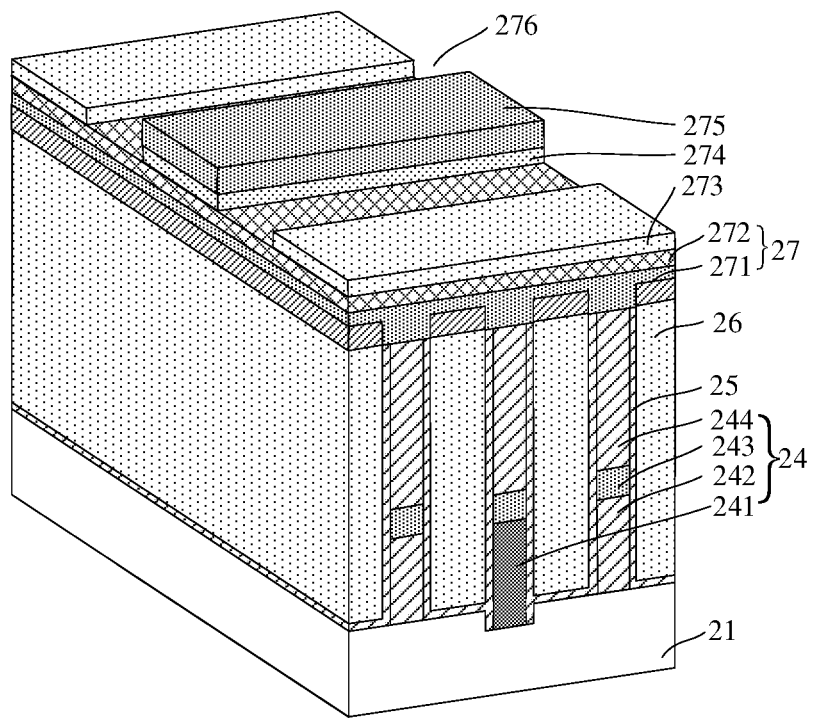

Referring to FIG. 9, a plurality of separate third mask layers 273, a fourth mask layer 274, and a fifth mask layer 275 may be formed on the second mask layer 272. The fourth mask layer 274 may be located on the third mask layers 273 and between the adjacent third mask layers 273. The fifth mask layer 275 may be located on the fourth mask layer 274, and the fifth mask layer 275 may be spaced apart from the third mask layers 273 in the arrangement direction of the third mask layers 273. Referring to FIG. 10, the material of the fourth mask layer 274 may be etched to form a first opening 276. After the first opening 276 is formed, the etching process may be performed again to etch the second mask layer 272 through the first opening 276.

The distance between adjacent first openings 276 may be determined based on an actual need.

Figure 11:
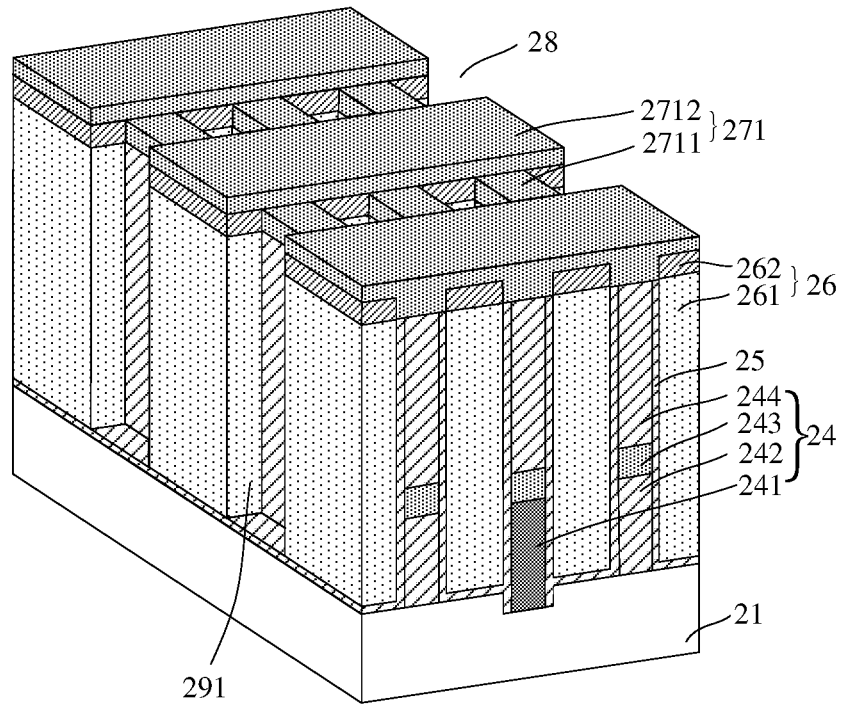

Referring to FIG. 11, a third etching process may be used to remove the second mask layer 272. The etching rate of the second mask layer 272 may be higher than the etching rates of the second dielectric layer 262 and the first mask layer 271. A fourth etching process may be used to etch the inter-layer dielectric layer 26 directly below the opening 28.

In some embodiments, the material of the second mask layer 272 may be silicon oxynitride, and the material of the first sidewall film 25 may be silicon nitride. The etching selection ratio of silicon oxynitride to silicon nitride is small. Therefore, the second mask layer may be removed before the first sidewall film 25 is exposed due to the etching of the inter-layer dielectric layer 26, which may help prevent the erosion of the first sidewall film 25 during the etching, thereby preventing the exposure of the conductive body layer 243, and ensuring good electrical performance of a semiconductor memory.

In some embodiments, when the third etching process is used to etch the second mask layer 272, the first mask layer 271 may locate directly below the opening 28 and above the bit line structures 24. Because the etching selection ratio of the second mask layer 272 to the first mask layer 271 is high, the erosion of the first mask layer 271 in the third etching process may be small. Therefore, the height of the upper dielectric layer 244 does not need to be increased, and the height of the inter-layer dielectric layer 26 in a direction perpendicular to the substrate 21 does not need to be correspondingly increased as well. The depth to width ratio of the contact hole will not increase, which can help reduce the process difficulty in etching the contact hole and filling the conductive layer subsequently. Additionally, the material of the upper dielectric layer 244 may not be eroded because of the etching. Therefore, a backfilling process is not needed, which may help optimize the manufacturing process and shorten the manufacturing cycle.

In some embodiments, the fourth etching process may be used to remove the inter-layer dielectric layer 26 directly below the opening 28 to form a dielectric layer opening 291. The bottom surface of the dielectric layer opening 291 may be the surface of the first sidewall film 25.

In some embodiments, the first mask layer 271 on the bit line structures 24 may protect the upper dielectric layer 244 during the fourth etching process, thereby preventing the erosion of the material of the upper dielectric layer 244 during the fourth etching process.

Figure 12:
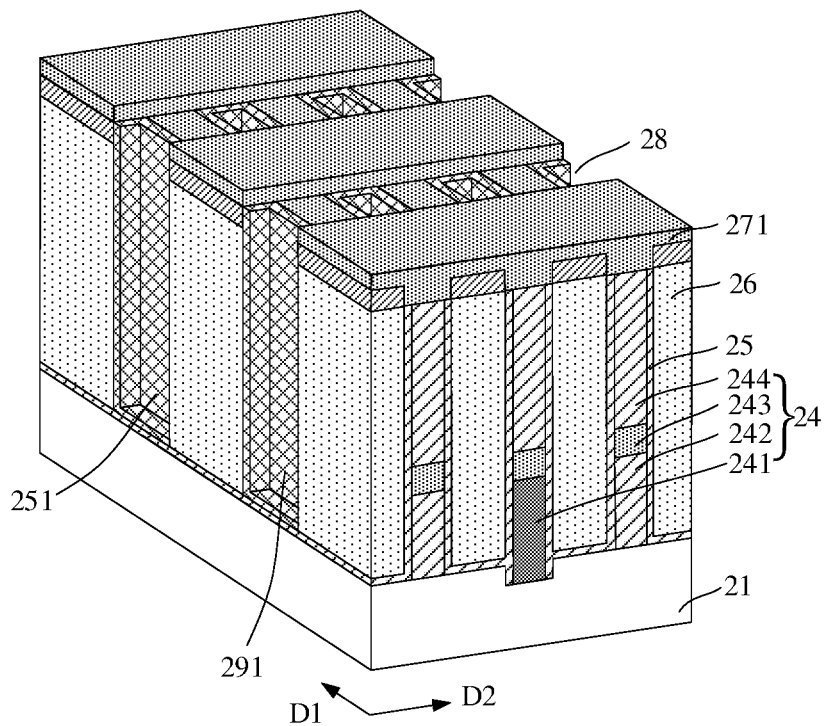

Referring to FIG. 12, a second sidewall film 251 may be formed on the sidewall of the dielectric layer opening 291, and the second sidewall film 251 may be located at the sidewall and the bottom surface of the dielectric layer opening 291.

In some embodiments, the material of the second sidewall film 251 may be the same as the material of the first sidewall film 25, and may be, for example, silicon nitride. In some embodiments, the material of the second sidewall film may be different from the material of the first sidewall film.

In some embodiments, the extension direction of the inter-layer dielectric layer 26 may be D2, and the arrangement direction of the inter-layer dielectric layers 26 may be D1. D1 may be the same as the first direction, and D2 may be the same as the second direction. That is, D1 may be perpendicular to D2.

Figure 13:
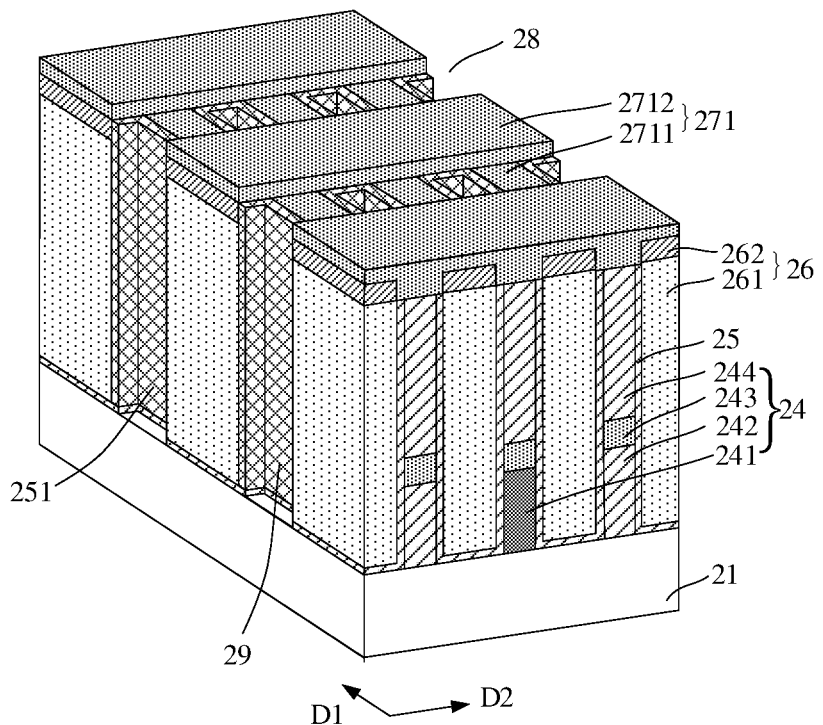

Referring to FIG. 13, a fifth etching process may be performed to etch the first sidewall film 25 and the second sidewall film 251 directly below the dielectric layer opening 291, to form a contact hole 29. The contact hole 29 may expose the surface of the substrate 21. The contact hole 29 may expose the surface of the active area.

In some embodiments, the second sidewall film 251 may be formed before the fifth etching process, which may help prevent the erosion of the first sidewall film 25 on the sidewall of the bit line structures 24 during the etching process, and ensure that the distance between adjacent contact holes 29 in the extension direction D2 of the inter-layer dielectric layer 26 meets a preset requirement, such that the parasitic capacitance and delay between adjacent conductive plugs are relatively small when the conductive plugs are filled in the contact holes 29.

Figure 14:
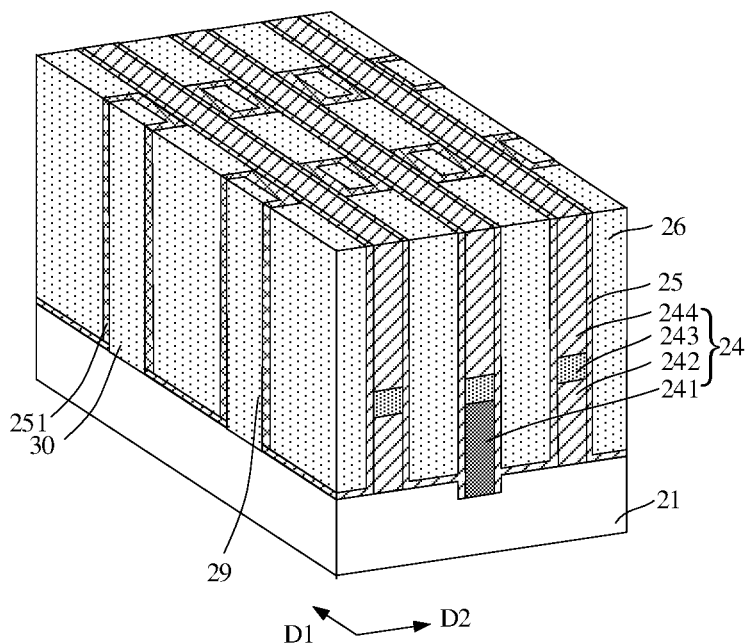

Referring to FIG. 14, conductive material may be filled to form a conductive plug 30, and the upper surface of the conductive plug 30, the upper surface of the inter-layer dielectric layer 26, and the upper surface of the bit line structures 24 may be configured to be level with each other.

After the contact hole 29 is formed, conductive material may be filled to form the conductive plug 30. After the conductive plug 30 is formed, a planarization process may be used to cause the upper surface of the conductive plug 30, the upper surface of the inter-layer dielectric layer 26, and the upper surface of the bit line structures 24 to be level with each other. The first mask layer 271 (referring to FIG. 13) may be removed individually by using the etching process, or may be removed collectively with the redundant material of the inter-layer dielectric layer 26 by using the planarization process.

In some embodiments, the upper surface of the bit line structures 24 may be lower than the upper surface of the inter-layer dielectric layer 26. When performing the third etching process for removing the second mask layer 272 (referring to FIG. 11), the fourth etching process for removing the inter-layer dielectric layer 26, and the fifth etching process for removing the first sidewall film 25 and the second mask layer 251 on the bottom surface of the dielectric layer opening 291 (referring to FIG. 13), the first mask sublayer 2711 between the adjacent inter-layer dielectric layers 26 and level with the second dielectric layer 262 may protect the upper dielectric layer 244 and prevent the erosion of the material of the upper dielectric layer 244, thereby optimizing the manufacturing process and shortening the manufacturing cycle while ensuring the performance of a semiconductor structure.

Additionally, the second sidewall film 251 may be formed before the fifth etching process, which may help prevent the erosion of the first sidewall film 25 on the sidewall of the bit line structures 24 during the etching process, and ensure that the distance between adjacent contact holes 29 in the extension direction D2 of the inter-layer dielectric layer 26 meets a preset requirement, such that the parasitic capacitance and delay between adjacent conductive plugs are relatively small when the conductive plugs are filled in the contact holes 29.

This application further provides a semiconductor structure.

Referring to FIG. 13, the semiconductor structure may include: a substrate 21, and a plurality of bit line structures 24 located on the substrate 21; an inter-layer dielectric layer 26, the inter-layer dielectric layer 26 may be located between the adjacent bit line structures 24, and the upper surface of the inter-layer dielectric layer 26 may be higher than the upper surface of the bit line structures 24; a first mask layer 271 having an etching window (not shown in FIG. 13). The first mask layer 271 may include a first mask sublayer 2711 and a second mask sublayer 2712. The first mask sublayer 2711 may be formed on the upper surface of the bit line structures 24 and may have a plurality of strip-shaped patterns extending in a first direction and spaced apart from each other. The upper surface of the first mask sublayer 2711 may be level with the upper surface of the inter-layer dielectric layer 26, and the second mask sublayer 2712 may be located on the upper surface of the first mask sublayer 2711 and the upper surface of the inter-layer dielectric layer 26 and may have a plurality of strip-shaped patterns extending in a second direction and spaced apart from each other. The second direction may be perpendicular to the first direction. A contact hole 29 may be disposed in the inter-layer dielectric layer 26 directly below the etching window, and the contact hole 29 may expose the substrate 21.

The embodiments of the semiconductor structure are described in detail with reference to the accompanying drawings.

In some embodiments, the semiconductor structure may further include a first sidewall film 25 and a second sidewall film 251. The first sidewall film 25 may be located on the sidewall of the bit line structures 24 and between the inter-layer dielectric layer 26 and the substrate 21, and the second sidewall film 251 may be located on the sidewall of the contact hole 29, specifically, on the first sidewall film 25 that is on the sidewall of the contact hole 29.

In some embodiments, the material of the second sidewall film 251 may be the same as the material of the first sidewall film 25, and may be, for example, silicon nitride. In some embodiments, the material of the second sidewall film may be different from the material of the first sidewall film.

In some embodiments, the inter-layer dielectric layer 26 may include a first dielectric layer 261 and a second dielectric layer 262. The second dielectric layer 262 may be located on the first dielectric layer 261. The upper surface of the second dielectric layer 262 may be higher than the upper surface of the bit line structures 24, and the material of the second dielectric layer 262 may be different from the material of the first dielectric layer 261.

The adhesion between the material of the second dielectric layer 262 and the first mask layer 271 may be greater than the adhesion between the material of the first dielectric layer 261 and the first mask layer 271. The material of the second dielectric layer 262 may be tetraethyl orthosilicate, and the material of the first dielectric layer 261 may be silicon oxide.

In some embodiments, the first mask layer 271 may be formed with different heights on the bit line structures 24 to prevent the erosion of the bit line structures 24 when the contact hole 29 is etched by using a conventional process, thereby optimizing the manufacturing process and shorten the process cycle.

A person of ordinary skill in the art may understand that the foregoing implementations are specific embodiments for implementing this invention. In practice, various modifications may be made to the implementations in forms and details without departing from the spirit and scope of this invention. Any person skilled in the art can make changes and modifications without departing from the spirit and scope of this invention. Therefore, the protection scope of this invention shall be subject to the scope defined in the claims.

What is claimed is:

1. A semiconductor structure manufacturing method, comprising:
providing a substrate, and forming a plurality of bit line structures on a surface of the substrate;
forming an inter-layer dielectric layer between adjacent bit line structures, wherein an upper surface of the inter-layer dielectric layer is higher than an upper surface of the bit line structures;
forming a first mask layer having an etching window, wherein the first mask layer comprises a first mask sublayer and a second mask sublayer, the first mask sublayer is formed on the upper surface of the bit line structures and has a plurality of strip-shaped patterns extending in a first direction and spaced apart from each other, an upper surface of the first mask sublayer is level with the upper surface of the inter-layer dielectric layer, the second mask sublayer is located on the upper surface of the first mask sublayer and the upper surface of the inter-layer dielectric layer and has a plurality of strip-shaped patterns extending in a second direction and spaced apart from each other, and the first direction is perpendicular to the second direction; and
etching the inter-layer dielectric layer by using the first mask layer as a mask, to form a contact hole, wherein the contact hole exposes the surface of the substrate.

2. The method according to claim 1, wherein the plurality of bit line structures on the surface of the substrate are spaced apart from each other, and the inter-layer dielectric layer is formed between the adjacent bit line structures.

3. The method according to claim 1, wherein the inter-layer dielectric layer comprises a first dielectric layer and a second dielectric layer, the first dielectric layer is located between the adjacent bit line structures, the second dielectric layer is located on an upper surface of the first dielectric layer, and an upper surface of the second dielectric layer is higher than the upper surface of the bit line structures.

4. The method according to claim 3, wherein forming the inter-layer dielectric layer between the adjacent bit line structures comprises:
forming the first dielectric layer between the adjacent bit line structures, wherein the upper surface of the first dielectric layer is level with the upper surface of the bit line structures;
etching the first dielectric layer to cause the upper surface of the first dielectric layer to be lower than the upper surface of the bit line structures; and
forming the second dielectric layer between the adjacent bit line structures, wherein the upper surface of the second dielectric layer is level with the upper surface of the bit line structures.

5. The method according to claim 4, further comprising:
after forming the second dielectric layer between the adjacent bit line structures, performing an etching process to cause the upper surface of the bit line structures to be lower than the upper surface of the second dielectric layer.

6. The method according to claim 5, wherein a height difference between the upper surface of the second dielectric layer and the upper surface of the bit line structures is 20 to 40 nm.

7. The method according to claim 5, further comprising:
after performing the etching process to cause the upper surface of the bit line structures to be lower than the upper surface of the second dielectric layer, forming the first mask layer on the upper surface of the second dielectric layer and the upper surface of the bit line structures, wherein an upper surface of the first mask layer on the upper surface of the second dielectric layer is level with an upper surface of the first mask layer on the bit line structures.

8. The method according to claim 7, wherein adhesion between the second dielectric layer and the first mask layer is greater than adhesion between the first dielectric layer and the first mask layer.

9. The method according to claim 1, wherein forming the first mask layer having the etching window comprises:
forming the first mask layer on the upper surface of the inter-layer dielectric layer and the upper surface of the bit line structures;
forming a second mask layer on the first mask layer;
forming, on the second mask layer, a photoresist layer that has a patterned opening, and performing a first etching process to remove the second mask layer directly below the patterned opening, wherein an etching rate of the second mask layer is higher than an etching rate of the first mask layer; and
performing a second etching process to remove part of the first mask layer directly below the patterned opening to form the etching window of the first mask layer, wherein an opening of the first mask layer exposes a surface of the inter-layer dielectric layer.

10. The method according to claim 9, wherein, during the second etching process, an etching by-product of a material of the first mask layer is different from an etching by-product of a material of the inter-layer dielectric layer, and an etching by-product detection process is performed during the second etching process, and the second etching process is ended when the etching by-product of the material of the inter-layer dielectric layer is detected.

11. The method according to claim 10, further comprising:
after the second etching process, performing a third etching process to remove the second mask layer, wherein the etching rate of the second mask layer is higher than the etching rate of the first mask layer, and the etching rate of the second mask layer is higher than an etching rate of the inter-layer dielectric layer.

12. The method according to claim 11, further comprising:
after the third etching process, performing a fourth etching process to remove the inter-layer dielectric layer directly below the patterned opening to form an opening of the inter-layer dielectric layer, wherein the etching rate of the inter-layer dielectric layer is higher than the etching rate of the first mask layer.

13. The method according to claim 12, further comprising:
after the bit line structures spaced apart from each other are formed on the surface of the substrate, forming a first sidewall film, wherein the first sidewall film is located on a sidewall of the bit line structures and a bottom of a gap between the adjacent bit line structures.

14. The method according to claim 13, further comprising:
after the fourth etching process, forming a second sidewall film on a sidewall and a bottom of the opening of the inter-layer dielectric layer, wherein a material of the second sidewall film is the same as a material of the first sidewall film.

15. The method according to claim 14, further comprising:
after forming the second sidewall film, performing a fifth etching process to remove the first sidewall film and the second sidewall film between the opening of the inter-layer dielectric layer and the substrate.

16. A semiconductor structure, comprising:
a substrate, and a plurality of bit line structures located on a surface of the substrate;
an inter-layer dielectric layer, wherein the inter-layer dielectric layer is located between adjacent bit line structures, and an upper surface of the inter-layer dielectric layer is higher than an upper surface of the bit line structures; and
a first mask layer having an etching window, wherein the first mask layer comprises a first mask sublayer and a second mask sublayer, the first mask sublayer is formed on the upper surface of the bit line structures and has a plurality of strip-shaped patterns extending in a first direction and spaced apart from each other, an upper surface of the first mask sublayer is level with the upper surface of the inter-layer dielectric layer, and the second mask sublayer is located on the upper surface of the first mask sublayer and the upper surface of the inter-layer dielectric layer and has a plurality of strip-shaped patterns extending in a second direction and spaced apart from each other,
wherein the second direction is perpendicular to the first direction, and a contact hole is disposed in the inter-layer dielectric layer directly below the etching window of the first mask layer, the contact hole exposing the surface of the substrate.

17. The structure according to claim 16, further comprising: a first sidewall film and a second sidewall film, wherein the first sidewall film is located on a sidewall of the bit line structures, and the second sidewall film is located on a sidewall of the contact hole and on a portion of the first sidewall film on the sidewall of the contact hole.

18. The structure according to claim 17, wherein a material of the first sidewall film is the same as a material of the second sidewall film, and the material of the first sidewall film comprises silicon nitride.

19. The structure according to claim 16, wherein the inter-layer dielectric layer comprises a first dielectric layer and a second dielectric layer, the second dielectric layer is located on the first dielectric layer, and an upper surface of the second dielectric layer is higher than the upper surface of the bit line structures.

* * * * *